(12) United States Patent
Zhang et al.

(10) Patent No.: US 11,476,451 B2
(45) Date of Patent: Oct. 18, 2022

(54) DISPLAY DEVICE AND MANUFACTURING METHOD THEREOF FOR REDUCING COLOR CAST BETWEEN VIEW ANGLES

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Bo Zhang, Beijing (CN); Yao Huang, Beijing (CN); Meng Li, Beijing (CN)

(73) Assignees: Chengdu BOE Optoelectronics Technology Co., Ltd., Sichuan (CN); Beijing BOE Technology Development Co., Ltd., Beijing (CN)

( * ) Notice: Subject to any disclaimer, the term of this patent is extended or adjusted under 35 U.S.C. 154(b) by 289 days.

(21) Appl. No.: 16/650,944

(22) PCT Filed: Mar. 27, 2019

(86) PCT No.: PCT/CN2019/079868
§ 371 (c)(1),
(2) Date: Mar. 26, 2020

(87) PCT Pub. No.: WO2020/191661
PCT Pub. Date: Oct. 1, 2020

(65) Prior Publication Data
US 2021/0242434 A1     Aug. 5, 2021

(51) Int. Cl.
*H01L 51/56* (2006.01)
*G03F 1/38* (2012.01)
*H01L 27/32* (2006.01)

(52) U.S. Cl.
CPC .............. *H01L 51/56* (2013.01); *G03F 1/38* (2013.01); *H01L 27/3276* (2013.01)

(58) Field of Classification Search
CPC . H01L 51/56; H01L 27/1248; H01L 27/3276; H01L 2227/323; G03F 1/38
(Continued)

(56) References Cited

U.S. PATENT DOCUMENTS

| 2012/0068185 A1* | 3/2012 | Kim | H01L 27/3262 |
| | | | 438/34 |
| 2018/0108686 A1* | 4/2018 | Liu | H01L 27/1262 |

(Continued)

FOREIGN PATENT DOCUMENTS

| CN | 102033370 A | 4/2011 | |
| CN | 104637874 A * | 5/2015 | ............. H01L 21/77 |

(Continued)

*Primary Examiner* — Matthew E. Gordon
(74) *Attorney, Agent, or Firm* — The Webb Law Firm

(57) ABSTRACT

The present disclosure provides a display substrate, a display device, a mask plate, and a manufacturing method. The manufacturing method includes forming a pattern structure on a base substrate including a first substrate portion and a second substrate portion adjacent to the first substrate portion, wherein the pattern structure is formed on the first substrate portion; forming a planarization layer on the base substrate, which includes a first planarization layer on the first substrate portion and a second planarization layer on the second substrate portion, wherein a projection of the first planarization layer on the base substrate at least partially covers that of the pattern structure on the base substrate; and removing a part of the first planarization layer to reduce a difference between a height of a surface of the first planarization layer and a height of a surface of the second planarization layer.

19 Claims, 7 Drawing Sheets

(58) Field of Classification Search
USPC .......................................................... 257/40
See application file for complete search history.

(56) References Cited

U.S. PATENT DOCUMENTS

| | | |
|---|---|---|
| 2018/0108781 A1 | 4/2018 | Fang et al. |
| 2018/0211888 A1* | 7/2018 | Liu .................... H01L 21/0273 |
| 2020/0168684 A1* | 5/2020 | Kim .................... H01L 27/3258 |

FOREIGN PATENT DOCUMENTS

| | | | |
|---|---|---|---|
| CN | 105449127 A | 3/2016 | |
| CN | 106653764 A | 5/2017 | |
| WO | WO-2016145822 A1 * | 9/2016 | ............. H01L 21/77 |

\* cited by examiner

DISPLAY DEVICE AND MANUFACTURING METHOD THEREOF FOR REDUCING COLOR CAST BETWEEN VIEW ANGLES

CROSS-REFERENCE TO RELATED APPLICATION

This application is the United States national phase of International Application No. PCT/CN2019/079868 filed Mar. 27, 2019, the disclosure of which is hereby incorporated by reference in its entirety.

TECHNICAL FIELD

The present invention relates to a display substrate, a display device, a mask plate, and a manufacturing method.

BACKGROUND

In recent years, with the development of display technology, OLED (Organic Light Emitting Diode) displays have become one of the research hotspots of flat panel displays. OLED displays have certain advantages in aspects such as brightness, contrast, and color domain.

SUMMARY

According to a aspect of the embodiments of the present disclosure, a manufacturing method for a display substrate is provided. The manufacturing method comprises: forming a pattern structure on a base substrate, wherein the base substrate comprises a first substrate portion and a second substrate portion adjacent to the first substrate portion, and the pattern structure is formed on the first substrate portion; forming a planarization layer on the base substrate, the planarization layer comprising a first planarization layer on the first substrate portion and a second planarization layer on the second substrate portion, wherein a projection of the first planarization layer on the base substrate at least partially covers a projection of the pattern structure on the base substrate, and a height from at least part of a surface of the first planarization layer on a side away from the base substrate to the base substrate is higher than a height from a surface of the second planarization layer on a side away from the base substrate to the base substrate; and removing a part of the first planarization layer so as to reduce a height difference between the height from the at least part of the surface of the first planarization layer on the side away from the base substrate to the base substrate and the height from the surface of the second planarization layer on the side away from the base substrate to the base substrate.

In some embodiments, during a process of forming the planarization layer, a height from the surface of the first planarization layer on the side away from the base substrate to the base substrate is higher than the height from the surface of the second planarization layer on the side away from the base substrate to the base substrate; and the surface of the second planarization layer on the side away from the base substrate comprises a plurality of portions, wherein the plurality of portions of the surface of the second planarization layer on the side away from the base substrate have a same height to the base substrate.

In some embodiments, the projection of the first planarization layer on the base substrate completely covers the projection of the pattern structure on the base substrate.

In some embodiments, the removing of the part of the first planarization layer comprises: performing an exposure process on the first planarization layer by a mask plate, wherein the mask plate comprises at least one first light transmitting region having a slit shape, and the at least one first light transmitting region corresponds to the first planarization layer; and performing a development process on the first planarization layer after the exposure process is performed.

In some embodiments, the mask plate comprises a plurality of first light transmitting regions distributed along the same direction as a length direction of the pattern structure; wherein the greater the height from the at least part of the surface of the first planarization layer on the side away from the base substrate to the base substrate is, the greater a width of a first light transmitting region corresponding to the at least part of the surface of the first planarization layer in the plurality of first light transmitting regions is; or the greater the height from the at least part of the surface of the first planarization layer on the side away from the base substrate to the base substrate is, the greater a distribution density of a first light transmitting region corresponding to the at least part of the surface of the first planarization layer in the plurality of first light transmitting regions is.

In some embodiments, the removing of the part of the first planarization layer comprises: performing a patterning process on the planarization layer after the planarization layer is formed.

In some embodiments, the performing of the patterning process on the planarization layer comprises: performing an exposure process on the planarization layer by a mask plate, wherein the mask plate comprises a first region comprising at least one first light transmitting region having a slit shape and at least one second light transmitting region, and the at least one first light transmitting region corresponds to the first planarization layer; and performing a development process on the planarization layer after the exposure process is performed, so as to remove the part of the first planarization layer, and form a via hole passing through the planarization layer in a part of the planarization layer corresponding to the at least one second light transmitting region.

In some embodiments, a width of the first light transmitting region ranges from 1 micrometer to 1.5 micrometers, and a length of the first light transmitting region ranges from 50 micrometers to 55 micrometers; and a radial dimension of the second light transmitting region ranges from 4.5 micrometers to 5.5 micrometers.

In some embodiments, the performing of the patterning process on the planarization layer comprises: performing an exposure process on the planarization layer by a mask plate, wherein the mask plate comprises a first region comprising at least one first light transmitting region having a slit shape, and the at least one first light transmitting region corresponds to the first planarization layer; and performing a development process on the planarization layer after the exposure process is performed, wherein a via hole passing through the planarization layer is formed in a part of the planarization layer corresponding to one of the at least one first light transmitting region.

In some embodiments, the performing of the patterning process on the planarization layer comprises: performing an exposure process on the planarization layer by a mask plate, wherein the mask plate comprises a first region comprising a first film layer having a first transmittance and a second film layer having a second transmittance that is adjacent to the first film layer, the first transmittance is less than the second transmittance, the first film layer comprises at least one first light transmitting region having a slit shape, and the at least one first light transmitting region corresponds to the first planarization layer; and performing a development process on the planarization layer after the exposure process is performed, so as to remove a part of the planarization layer corresponding to the second film layer, and to remove a part in a part of the planarization layer corresponding to the first film layer.

In some embodiments, the mask plate further comprises a second region adjacent to the first region, wherein the second region comprises a third film layer having a third transmittance and a fourth film layer having a fourth transmittance that is adjacent to the third film layer, the third transmittance is less than the fourth transmittance, the third transmittance is not equal to the first transmittance, and the second transmittance is equal to the fourth transmittance.

In some embodiments, the first light transmitting region is a slit.

In some embodiments, the manufacturing method further comprises: forming an electrode layer on the planarization layer; and forming a functional layer for a sub-pixel on the electrode layer.

In some embodiments, the pattern structure comprises a conductive wire.

According to another aspect of the embodiments of the present disclosure, a display substrate is provided. The display substrate comprises: a base substrate, wherein the base substrate comprises a first substrate portion and a second substrate portion adjacent to the first substrate portion; a pattern structure on the first substrate portion; and a planarization layer on the base substrate, wherein the planarization layer comprises a first planarization layer on the first substrate portion and a second planarization layer on the second substrate portion, a projection of the first planarization layer on the base substrate at least partially covers a projection of the pattern structure on the base substrate, and the first planarization layer comprises at least one recess.

In some embodiments, at least part of a projection of the at least one recess on the base substrate overlaps with at least part of the projection of the pattern structure on the base substrate.

In some embodiments, a depth of the recess ranges from 0.01 micrometer to 0.5 micrometer.

In some embodiments, the pattern structure comprises a conductive wire; and the recess comprises a groove; wherein an extending direction of the conductive wire is the same as an extending direction of the groove.

In some embodiments, the display substrate further comprises: an electrode layer on the planarization layer and a functional layer for a sub-pixel on the electrode layer.

According to another aspect of the embodiments of the present disclosure, a display device is provided. The display device comprises: the display substrate as described above.

According to one aspect of the embodiments of the present disclosure, a mask plate for the manufacturing method as described above is provided. The mask plate comprises: at least one first light transmitting region having a slit shape, which is configured to correspond to a first planarization layer in a red sub-pixel; wherein a width of each of the at least one first light transmitting region ranges from 1 micrometer to 1.5 micrometers, and a length of each of the at least one first light transmitting region ranges from 50 micrometers to 55 micrometers.

Other features and advantages of the present disclosure will become apparent from the following detailed description of exemplary embodiments of the present disclosure with reference to the accompanying drawings.

BRIEF DESCRIPTION OF THE DRAWINGS

The accompanying drawings, which constitute part of this specification, illustrate exemplary embodiments of the present disclosure and, together with this specification, serve to explain the principles of the present disclosure.

The present disclosure may be more clearly understood from the following detailed description with reference to the accompanying drawings, in which.

Figure 1:
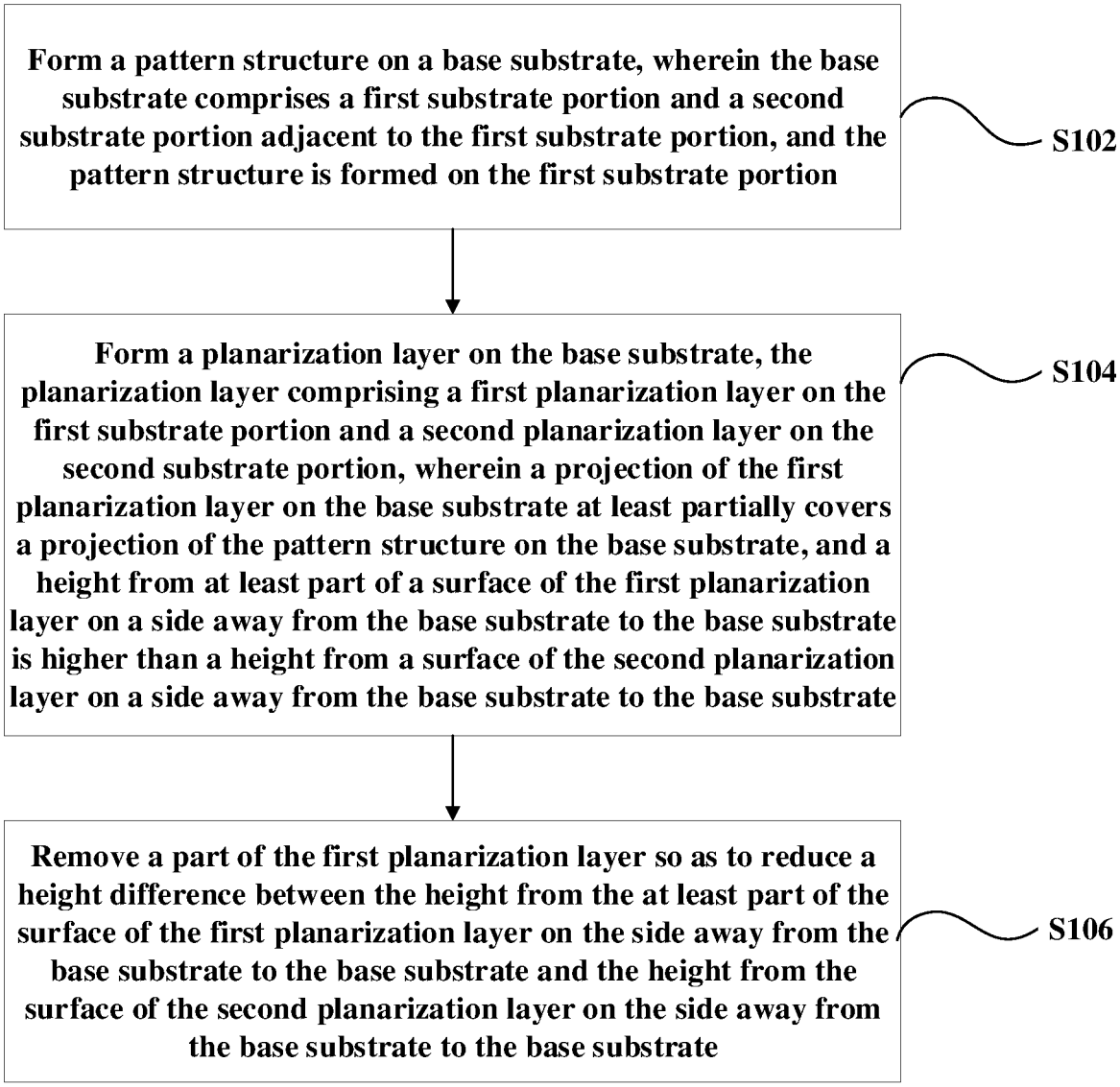
FIG. 1 is a flowchart showing a manufacturing method for a display substrate according to an embodiment of the present disclosure.

It should be understood that the dimensions of the various parts shown in the accompanying drawings are not necessarily drawn according to the actual scale. In addition, the same or similar reference signs are used to denote the same or similar components.

DETAILED DESCRIPTION

Various exemplary embodiments of the present disclosure will now be described in detail with reference to the accompanying drawings. The description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The use of the terms "first", "second" and similar words in the present disclosure do not denote any order, quantity or importance, but are merely used to distinguish between different parts. A word such as "comprise", "include" or the like means that the element before the word covers the element(s) listed after the word without excluding the possibility of also covering other elements. The terms "up", "down", "left", "right", or the like are used only to represent a relative positional relationship, and the relative positional relationship may be changed correspondingly if the absolute position of the described object changes.

In the present disclosure, when it is described that a particular device is located between the first device and the second device, there may be an intermediate device between the particular device and the first device or the second device, and alternatively, there may be no intermediate device. When it is described that a particular device is connected to other devices, the particular device may be directly connected to said other devices without an intermediate device, and alternatively, may not be directly connected to said other devices but with an intermediate device.

All the terms (comprising technical and scientific terms) used in the present disclosure have the same meanings as understood by those skilled in the art of the present disclosure unless otherwise defined. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

Figure 14:
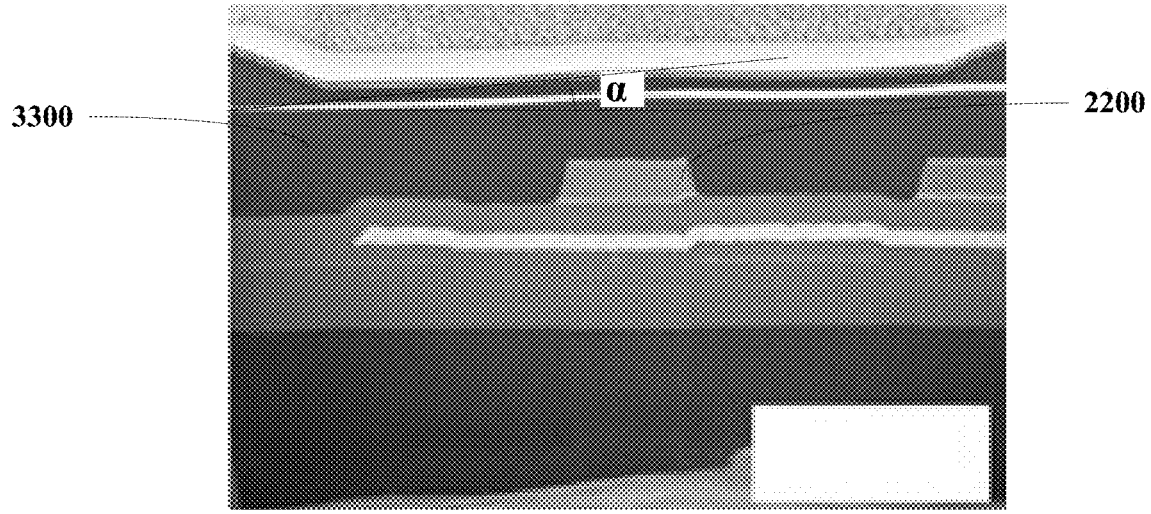
FIG. 14 is a FIB (Focused Ion Beam) transmission electron micrograph showing a partial structure of a sub-pixel in a display substrate.

The inventors of the present disclosure have found that, as shown in FIG. 14, in an OLED display (e.g., having a GGRB pixel arrangement), a planarization layer (PLN) 3300 covers a conductive wire 2200, which may cause an upper surface of the planarization layer to be inclined and cause the planarization layer to have a certain slope angle α (which will be shown in conjunction with the drawings later). For example, the slope angle α may range from 2 to 5 degrees. After a light emitting layer is formed by evaporation, the inclined upper surface of the above-described planarization layer may cause that a part of the light emitting layer of a red sub-pixel above the conductive wire is slightly high, thereby causing that the light emitting layer is inclined at an angle. In the white state screen, when viewed from the left and right sides of the display panel, the display panel may exhibit a phenomenon of a reddish view angle. For some high-end display or special display places, for example, in fields such as medical service and graphic design, there are very strict requirements for color cast between view angles (i.e., a color difference between different view angles).

In view of this, the embodiments of the present disclosure provide a manufacturing method for a display substrate to improve the problem of color cast between view angles. Hereinafter, a manufacturing method for a display substrate according to some embodiments of the present disclosure may be described in detail in conjunction with the accompanying drawings.

FIG. 1 is a flowchart showing a manufacturing method for a display substrate according to an embodiment of the present disclosure. As shown in FIG. 1, the manufacturing method may comprise steps S102 to S106.

At step S102, a pattern structure is formed on a base substrate, wherein the base substrate comprises a first substrate portion and a second substrate portion adjacent to the first substrate portion, and the pattern structure is formed on the first substrate portion. For example, the pattern structure may comprise a conductive wire.

At step S104, a planarization layer is formed on the base substrate. The planarization layer comprises a first planarization layer on the first substrate portion and a second planarization layer on the second substrate portion. The projection of the first planarization layer on the base substrate at least partially covers a projection of the pattern structure on the base substrate. A height from at least part of a surface of the first planarization layer on a side away from the base substrate to the base substrate is higher than a height from the surface of the second planarization layer on a side away from the base substrate to the base substrate.

At step S106, a part of the first planarization layer is removed to reduce a height difference between the height from the at least part of the surface of the first planarization layer on the side away from the base substrate to the base substrate and the height from the surface of the second planarization layer on the side away from the base substrate to the base substrate.

For example, a part of the first planarization layer may be removed by exposure and development techniques, which reduces the height of the surface of the first planarization layer on the side away from the base substrate. By way of this removal step, the first planarization layer may be made to be substantially flush with the second planarization layer.

So far, a manufacturing method for a display substrate according to some embodiments of the present disclosure is provided. In this manufacturing method, a pattern structure is formed on a base substrate. The base substrate comprises a first substrate portion and a second substrate portion adjacent to the first substrate portion. The pattern structure is formed on the first substrate portion. A planarization layer is formed on the base substrate. The planarization layer comprises a first planarization layer on the first substrate portion and a second planarization layer on the second substrate portion. A projection of the first planarization layer on the base substrate a least partially covers a projection of the pattern structure on the base substrate. A height from at least part of a surface of the first planarization layer on a side away from the base substrate to the base substrate is higher than a height from a surface of the second planarization layer on a side away from the base substrate to the base substrate. Then, a part of the first planarization layer is removed. This may reduce the height (or average height) from the at least part of the surface of the first planarization layer on the side away from the base substrate to the base substrate, so that it is possible to reduce a height difference between the height of the surface of the first planarization layer and a height (or average height) from a surface of the second planarization layer on a side away from the base substrate to the base substrate. In this way, during a process of forming a light emitting layer above the planarization layer in the subsequent steps, it is possible to reduce a slope angle of the light emitting layer, thereby reducing the problem of color cast between view angles of the display screen and improving the display effect of the display screen.

FIGS. 2 to 3, FIG. 4A, FIG. 5, FIG. 6A, FIG. 7, FIG. 8A, FIG. 9, FIG. 10A, and FIGS. 11 to 12 are cross-sectional views showing structures at several stages during a manufacturing process of a display substrate according to some embodiments of the present disclosure. These cross-sectional views may be cross-sectional views of the structures at several stages taken along the line A-A' in FIG. 13. FIG. 4B, FIG. 6B, FIG. 8B and FIG. 10B are top views showing mask plates according to some embodiments of the present disclosure. The manufacturing process of a display substrate according to some embodiments of the present disclosure will be described in detail below in conjunction with these accompanying drawings.

Figure 2:
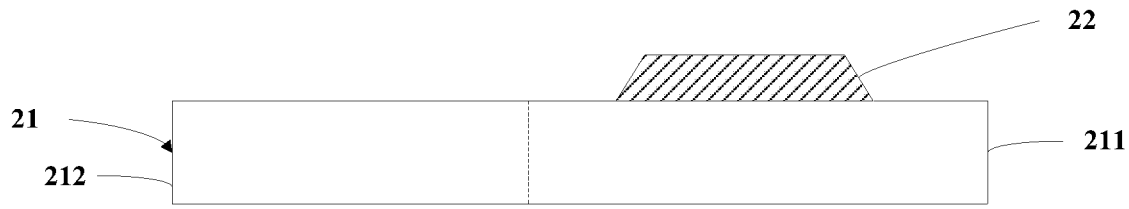
FIG. 2 is a cross-sectional view showing a structure at a stage during a manufacturing process of a display substrate according to an embodiment of the present disclosure.

First, as shown in FIG. 2, a pattern structure 22 is formed on a base substrate 21, for example by processes such as deposition and patterning. For example, the pattern structure may be a conductive wire such as a data line. The base substrate 22 may comprise a first substrate portion 211 and a second substrate portion 212 adjacent to the first substrate portion 211r. The pattern structure 22 is formed on the first substrate portion 211. For example, the base substrate 21 may comprise an initial base substrate (e.g., a flexible base substrate or a rigid base substrate) and a structural layer (not shown) on the initial base substrate. For example, the structural layer may comprise a structural layer (e.g., a source, a drain, a gate, a gate insulation layer, and the like) for a thin film transistor.

Figure 3:
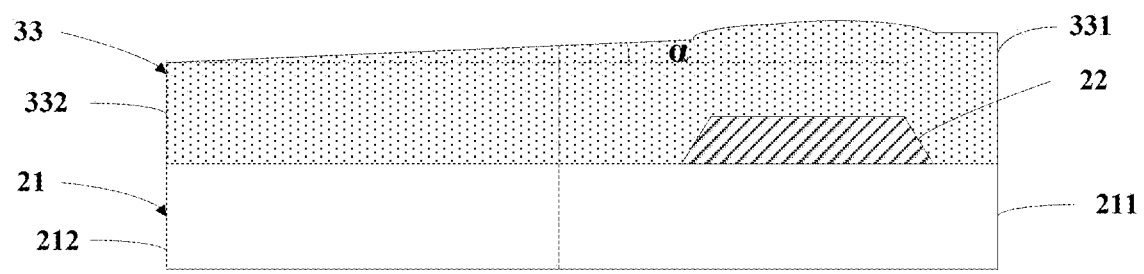
FIG. 3 is a cross-sectional view showing a structure at another stage during a manufacturing process of a display substrate according to an embodiment of the present disclosure.

Next, as shown in FIG. 3, a planarization layer 33 is formed on the base substrate 21. The planarization layer 33 may comprise a first planarization layer 331 on the first substrate portion 211 and a second planarization layer 332 on the second substrate portion 212. The first planarization layer 331 and the second planarization layer 332 are continuous layer structures. A projection of the first planarization layer 331 on the base substrate 21 at least partially covers a projection of the pattern structure 22 on the base substrate 21. For example, the projection of the first planarization layer 331 on the base substrate 21 completely covers the projection of the pattern structure 22 on the base substrate 21. In some embodiments, the first planarization layer 331 covers the pattern structure 22. A material of the planarization layer 33 may comprise an organic material such as resin. For example, the resin may be a modified resin. Such resin may be used in an irradiation reaction after modification.

During the process of forming the planarization layer, as shown in FIG. 3, a height from at least part of a surface of the first planarization layer 331 on a side away from the base substrate 21 to the base substrate 21 is higher than a height from the second planarization layer 332 on a side away from the base substrate 21 to the base substrate. The height here may be an average height. For example, the height from the surface of the first planarization layer 331 on the side away from the base substrate 21 to the base substrate is higher than the height t from the surface of the second planarization layer 332 on the side away from the base substrate 21 to the base substrate. This causes the surface of the planarization layer 33 on the side away from the base substrate 21 to be inclined and causes the planarization layer 33 to have a certain slope angle α. The slope angle α is an angle formed between a surface of the planarization layer on a side away from the base substrate and a surface of the planarization layer on a side proximate to the base substrate. For example, the surface of the planarization layer proximate to the base substrate is the surface of the planarization layer that is in contact with the base substrate.

In some embodiments, the surface of the second planarization layer 332 on the side away from the base substrate 21 may comprise a plurality of portions (not shown). That is, the surface of the second planarization layer may be divided into a plurality of portions. The plurality of portions of the surface of the second planarization layer 332 on the side away from the base substrate 21 have a same height to the base substrate 21. That is, the second planarization layer 332 may be a flat layer structure. It should be noted that the "same" here comprises, but is not limited to "absolutely same". There may be certain errors, just like a definition by adding "substantially" before "same".

Next, a part of the first planarization layer 331 is removed. This may reduce a height difference between the height of at least part of an upper surface of the first planarization layer 331 and the height of an upper surface of the second planarization layer 332. Here, the height of the upper surface of the first planarization layer 331 is the height from the surface of the first planarization layer on the side away from the base substrate 21 to the base substrate, and the height of the upper surface of the second planarization layer 332 is the height from the surface of the second planarization layer 332 on the side away from the base substrate 21 to the base substrate 21. For example, by way of this removal step, the upper surface of the first planarization layer 311 may be made to be substantially flush with the upper surface of the second planarization layer 332.

The process of removing apart of the first planarization layer according to some embodiments of the present disclosure will be described respectively below in conjunction with the accompanying drawings.

Figure 4A:
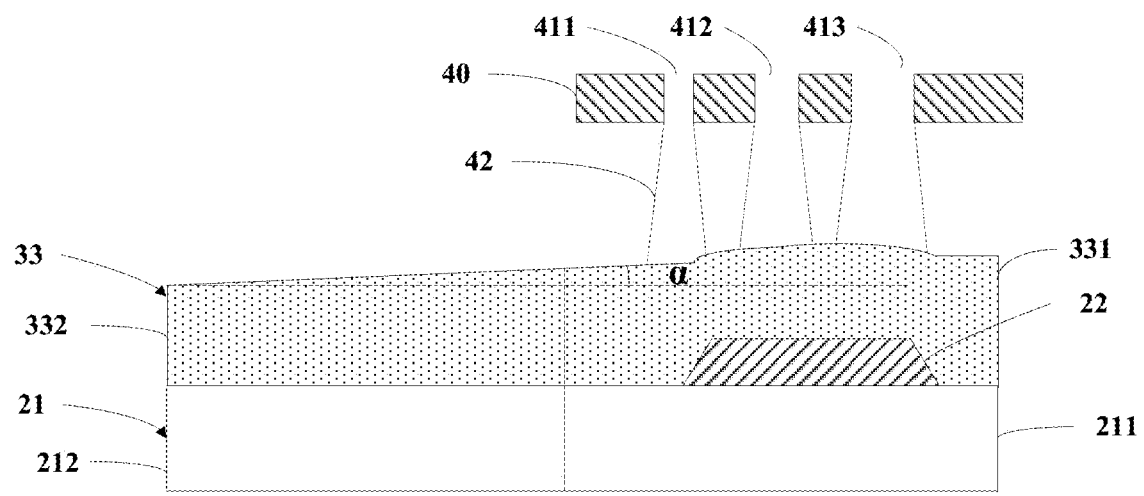
FIG. 4A is a cross-sectional view showing a structure at another stage during a manufacturing process of a display substrate according to an embodiment of the present disclosure.
Figure 4B:
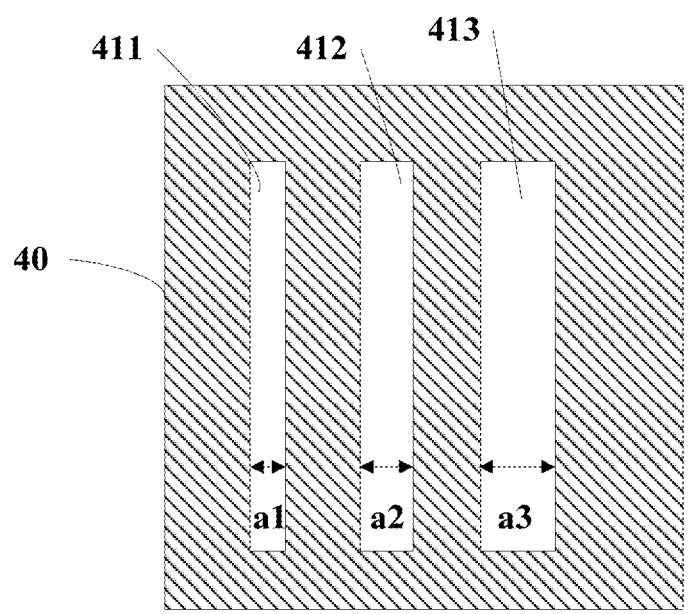
FIG. 4B is a top view showing a mask plate according to an embodiment of the present disclosure.
Figure 5:
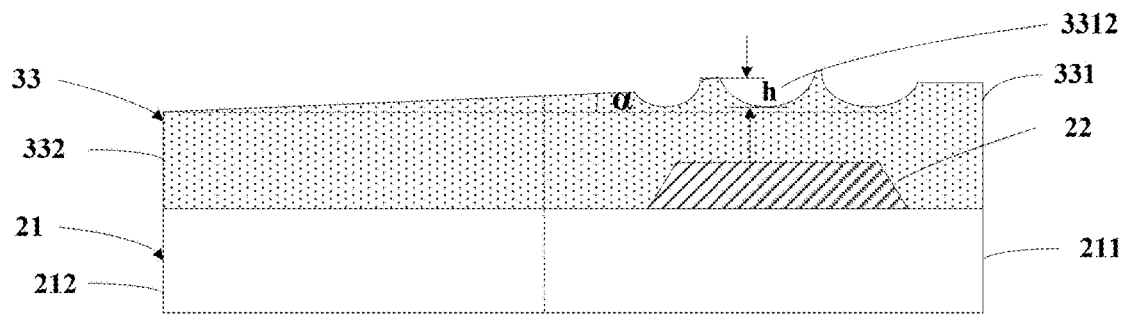
FIG. 5 is a cross-sectional view showing a structure at another stage during a manufacturing process of a display substrate according to an embodiment of the present disclosure.

In some embodiments, the step of removing a part of the first planarization layer may be described in conjunction with FIGS. 4A, 4B, and 5.

For example, as shown in FIG. 4A, an exposure process may be performed on the first planarization layer 331 by a mask plate 40. For example, a material of the mask plate may comprise a photoresist. As shown in FIGS. 4A and 4B, the mask plate 40 may comprise at least one first light transmitting region having a slit shape. Here, the slit shape may be an elongated rectangle, an elongated oval, or other shapes. In addition, the slit shape may be a continuous elongated shape or a plurality of elongated shapes that are spaced apart. For example, the first light transmitting region is a slit. For example, the at least one first light transmitting region comprises a plurality of first light transmitting regions (e.g., the first light transmitting regions 411, 412, and 413). The at least one first light transmitting region corresponds to the first planarization layer 331. Here, "corresponding" as described means that during the exposure process, the first light transmitting region is aligned with the part of the first planarization layer that needs to be exposed, so that light may pass through the first light transmitting region and reach the part that needs to be exposed so as to expose the part. In addition, FIG. 4A also shows a light beam 42 for exposure.

Figure 13:
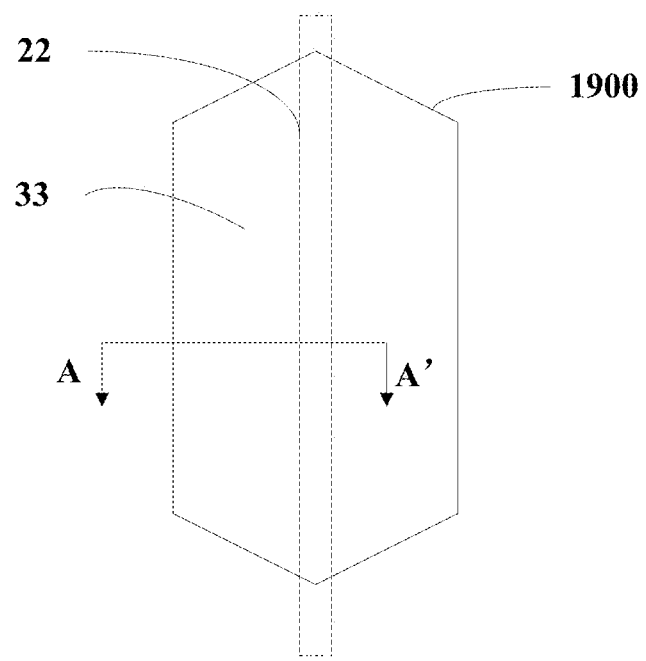
FIG. 13 is a schematic view showing a shape of an opening of a pixel defining layer of a sub-pixel in a display substrate according to an embodiment of the present disclosure.

In some embodiments, the plurality of first light transmitting regions are distributed along the same direction as a length direction (e.g., as shown in FIG. 13) of the pattern structure (e.g., a conductive wire). In other words, the plurality of first light transmitting regions are distributed along a length direction of the surface of the first planarization layer on the side away from the base substrate. For example, FIG. 13 shows an opening 1900 of the pixel defining layer. In each sub-pixel (e.g., a red sub-pixel), the length direction of the surface of the first planarization layer on the side away from the base substrate is a length direction of the opening 1900, which substantially conforms to the length direction of the pattern structure (e.g., a conductive wire) 22.

In some embodiments, the greater the height from the at least part of the surface of the first planarization layer 331 on the side away from the base substrate to the base substrate is, the greater a width of a first light transmitting region corresponding to the at least part of the surface of the first planarization layer in the plurality of first light transmitting regions is. Here, the width refers to a dimension perpendicular to the length direction. For example, the higher the height of the above-described surface of the first planarization layer is, the greater the width of the first light transmitting region will be, in a case where a distribution density of the plurality of first light transmitting regions is fixed. For example, as shown in FIGS. 4A and 4B, a width a1 of the first light transmitting region 411<a width a2 of the first light transmitting region 412<a width a3 of the first light transmitting region 413. As shown in FIG. 4A, the greater the width of the first light transmitting region is, the greater a light intensity of the light beam 42 passing through the first light transmitting region is. In this way, more portions of the first planarization layer are removed during subsequent development. As shown in FIG. 4A, after the light beam 42 passes through the first light transmitting region, a phenomenon such as light divergence or diffraction may occur.

In some embodiments, the greater the height from the at least part of the surface of the first planarization layer 331 on the side away from the base substrate to the base substrate is, the greater a distribution density of a first light transmitting region corresponding to the at least part of the surface of the first planarization layer in the plurality of first light transmitting regions is. For example, in a case where the width of each first planarization layer is fixed, in the same direction as the length direction of the pattern structure, the higher the height of the above-described surface of the first planarization layer 331 is, the greater the distribution density of the first light transmitting regions will be. It is also possible that, in other directions, the higher the height of the surface of the first planarization layer 331 is, the greater the distribution density of the first light transmitting regions will be. In this way, after the first planarization layer is exposed and developed (described below), the height from the surface of the first planarization layer to the base substrate may be more uniform.

Next, as shown in FIG. 5, after the exposure process is performed, a development process is performed on the first planarization layer 331. By way of this development process, a part (e.g., an exposed portion) of the first planarization layer is removed, so that an average height from the surface of the first planarization layer on the side away from the base substrate may be reduced, and a slope angle α may be reduced, thereby further reducing the problem of color cast between view angles of the display screen, and improving the display effect of the display screen. For example, a reduced slope angle α may range from 0 degree to 0.5 degree.

It should be noted that the planarization layer in the embodiments of the present disclosure may have the characteristic of a positive photoresist. That is, during the development process, an exposed part of the planarization layer (i.e., the part of the first planarization layer) may be removed. However, the scope of the present disclosure is not limited thereto. For example, the planarization layer may have the characteristics of a negative photoresist. For such planarization layer having the characteristics of a negative photoresist, when a mask plate is designed, for example, the first light transmitting region of the original mask plate may be replaced by an opaque region, and an opaque region of the original mask plate may be replaced by a light transmitting region. After the planarization layer is exposed by such mask plate, an unexposed part of the planarization layer (i.e., the part of the first planarization layer) may be removed by a development process.

In some embodiments, as shown in FIG. 5, after exposure and development processes, at least one recess 3312 may be formed on the surface of the first planarization layer 331. For example, the recess may comprise a groove. Such recess reduces an average height of the above-described surface of the first planarization layer. In some embodiments, the depth h of the recess 3312 may range from 0.01 micrometer to 0.5 micrometer. For example, the depth h of the recess may be 0.05 micrometer, 0.1 micrometer, 0.3 micrometer, or the like. The depth of the recess refers to the distance between the bottom of the recess and the top of the protrusion around the recess.

In other embodiments, the light beams passing through all the first light transmitting regions might partially overlap due to divergence in a case where the number of the first light-transmitting regions is relatively large. In this way, most of the surface of the first planarization layer on the side away from the base substrate may be exposed and developed, thereby facilitating making the surface of the first planarization layer as flat as possible.

In some embodiments, after the planarization layer is formed, a patterning process may also be performed on the planarization layer so as to form a via hole passing through the planarization layer in the planarization layer, so that an electrode layer (e.g., an anode layer) passing through the via hole may be formed in subsequent steps. For example, the above-described step of removing the part of the first planarization layer by a mask plate may be performed after the patterning process. For example, a photoresist may be formed on the planarization layer after the patterning process, the photoresist is patterned by exposure and development processes, and then the patterned photoresist is used as a mask to perform a process such as dry etching on the planarization layer, thereby realizing the step of removing the part of the first planarization layer.

So far, a manufacturing method for a display substrate according to some embodiments of the present disclosure is provided. The above-described manufacturing method may reduce the height of the surface of the first planarization layer on the side away from the base substrate. In this way, during the process of forming a light emitting layer above the planarization layer in subsequent steps, it is possible to reduce a slope angle of the light emitting layer, thereby reducing the problem of color cast between view angles of the display screen and improving the display effect of the display screen.

In other embodiments, the removing of the part of the first planarization layer comprises: performing a patterning process on the planarization layer after the planarization layer is formed. During the process of performing the patterning process, the step of removing the part of the first planarization layer may be performed. The step of performing the patterning process on the planarization layer according to some embodiments will be described in detail below in conjunction with the accompanying drawings.

Figure 6A:
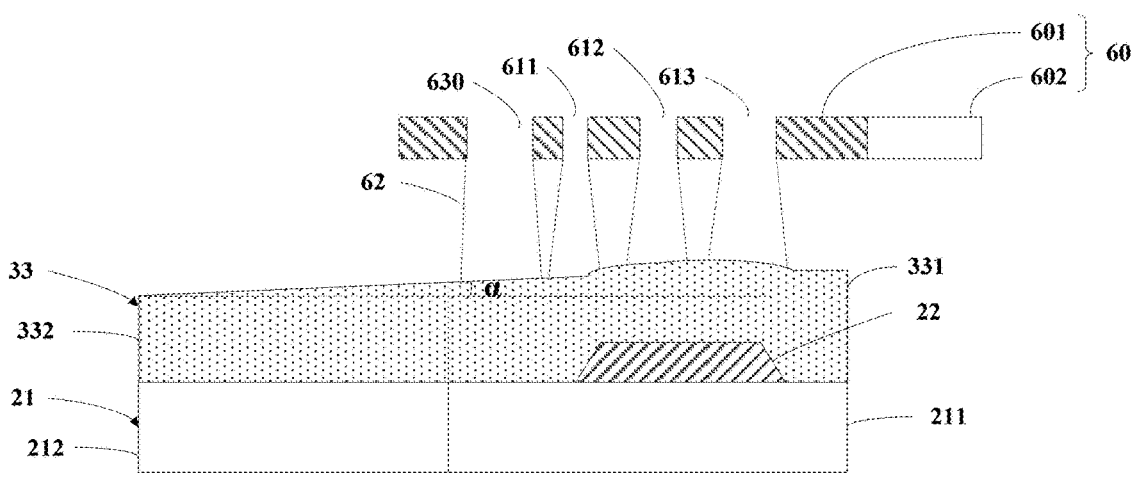
FIG. 6A is a cross-sectional view showing a structure at another stage during a manufacturing process of a display substrate according to an embodiment of the present disclosure.
Figure 6B:
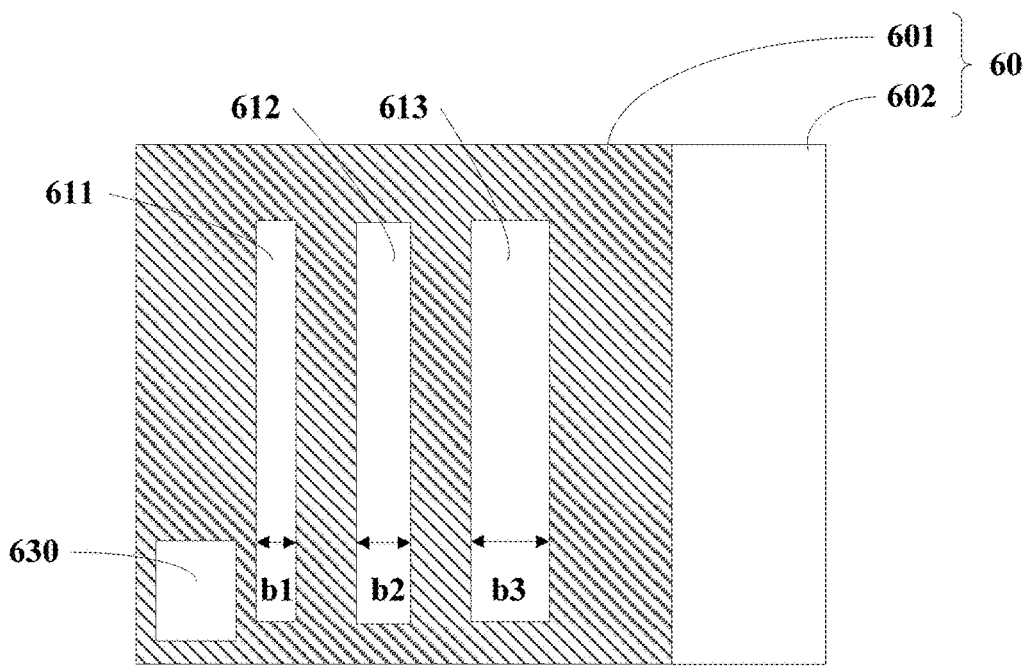
FIG. 6B is a top view showing a mask plate according to another embodiment of the present disclosure.
Figure 7:
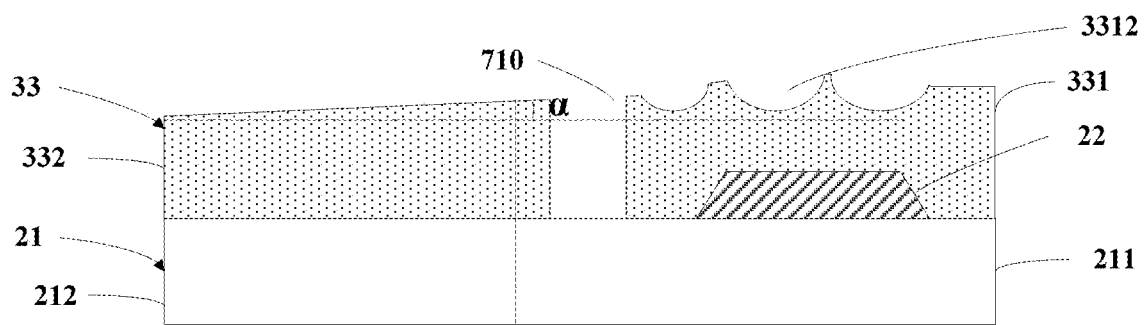
FIG. 7 is a cross-sectional view showing a structure at another stage during a manufacturing process of a display substrate according to an embodiment of the present disclosure.

In some embodiments, the step of performing the patterning process on the planarization layer may be described in conjunction with FIGS. 6A, 6B, and 7.

For example, as shown in FIG. 6A, an exposure process is performed on the planarization layer 33 by a mask plate 60. As shown in FIGS. 6A and 6B, the mask plate 60 may comprise a first region 601. The first region 601 may comprise at least one first light transmitting region (e.g., the first light transmitting regions 611, 612, and 613) having a slit shape and at least one second light transmitting region 630. The second light transmitting region may be on a side of the at least one first light transmitting region. For example, The second light transmitting region may be at a lower left corner, an upper right corner, or other positions of the at least one first light transmitting region. A transmittance (here, the transmittance refers to the transmittance of light) of the second light transmitting region may be equal to a transmittance of the first light transmitting region, or may be different from the transmittance of the first light transmitting region. The at least one first light transmitting region corresponds to the first planarization layer 331. For example, the second light transmitting region 630 may be a through hole. In some embodiments, the mask plate 60 may comprise a second region 602 adjacent to the first region 601. During the exposure process, the second region 602 may be aligned with a non-display area (not shown) of the display substrate. For example, the non-display area may comprise an area where an integrated circuit is formed. In addition, FIG. 6A also shows a light beam 62 for exposure.

It should be noted that although FIGS. 6A and 6B show one second light transmitting region 630, the second light transmitting region corresponding to one sub-pixel is shown here. Those skilled in the art can understand that, since the display substrate comprises a plurality of sub-pixels, the first region of the above-described mask plate comprises a plurality of second light transmitting regions.

It should also be noted that a shape of the second light transmitting region 630 is not limited to a quadrangle, and may also be other shapes. For example, the shape of the second light transmitting region may be other polygons, circles, or irregular shapes.

In some embodiments, a width of the first light transmitting region ranges from 1 micrometer to 1.5 micrometers, and a length of the first light transmitting region ranges from 50 micrometers to 55 micrometers. In some embodiments, a radial dimension of the second light transmitting region ranges from 4.5 micrometers to 5.5 micrometers. With such size, it is easier to form a via hole in apart of the planarization layer corresponding to the second light transmitting region after exposure.

In some embodiments, similar to the foregoing description, a width $b1$ of the first light transmitting region $611<$ a width $b2$ of the first light transmitting region $612<$ a width $b3$ of the first light transmitting region 613.

Next, as shown in FIG. 7, a development process is performed on the planarization layer 33 after the exposure process is performed to remove a part of the first planarization layer. A via hole 710 passing through the planarization layer is formed in a part of the planarization layer 33 corresponding to the second light transmitting region 630 (or a part aligned with the second light transmitting region 630). For example, the light intensity of the light beam passing through the second light transmitting region is relatively large in a case where the size of the second light transmitting region 630 is relatively large (e.g., the radial direction of the second light transmitting region 630 is larger than the width of the first light transmitting region). Therefore, the part of the planarization layer corresponding to the second light transmitting region is exposed more, so that the part is removed more during development to form a via hole, so as to form an electrode layer (e.g., an anode layer) passing through the via hole in subsequent steps.

In addition, since the mask plate 60 comprises the second region 602, a part of the planarization layer corresponding to the second region may also be exposed and developed. For example, at least a part of the planarization layer in the non-display area may also be removed in the above-described step.

So far, a manufacturing method for a display substrate according to other embodiments of the present disclosure is provided. By the manufacturing method, not only a via hole is formed in the planarization layer, but also a part of the first planarization layer is removed, so that an average height of the surface of the first planarization layer on the side away from the base substrate is reduced, and the slope angle α is reduced, thereby reducing the problem of color cast between view angles of the display screen, and improving the display effect of the display screen. Compared with the manufacturing method in which exposure and development are performed after patterning the planarization layer, the times of exposure and development in this manufacturing method are reduced, so that this manufacturing method may reduce the cost.

Figure 8A:
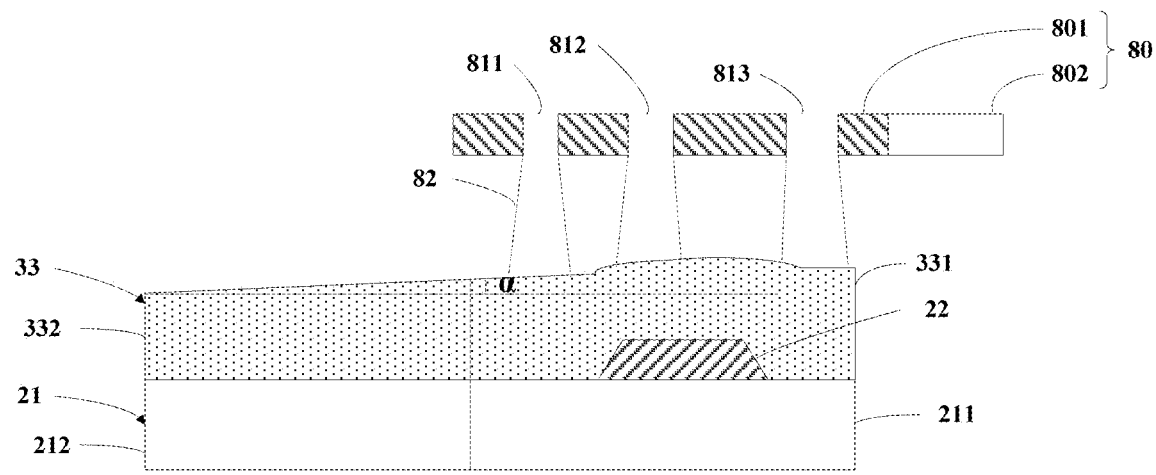
FIG. 8A is a cross-sectional view showing a structure at another stage during a manufacturing process of a display substrate according to an embodiment of the present disclosure.
Figure 8B:
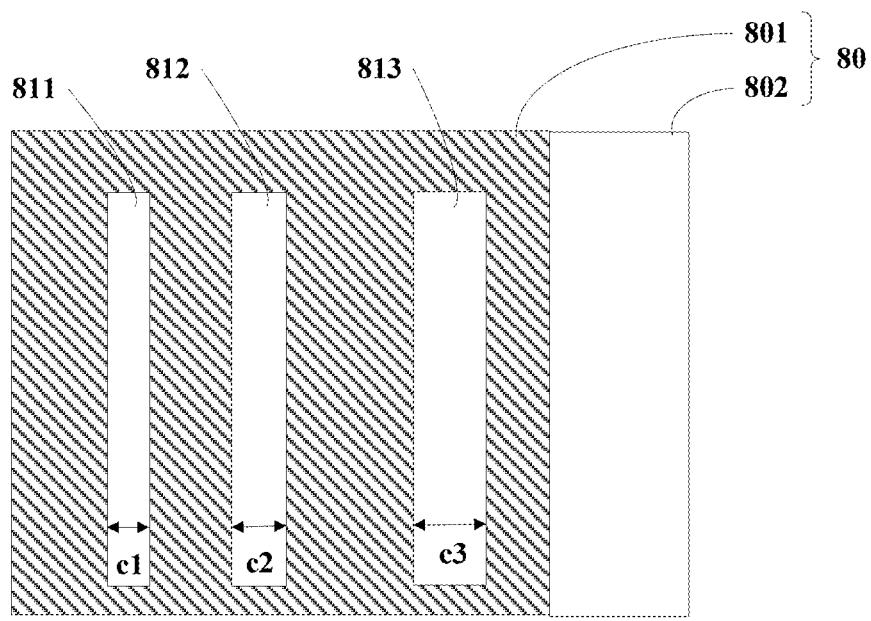
FIG. 8B is a top view showing a mask plate according to another embodiment of the present disclosure.
Figure 9:
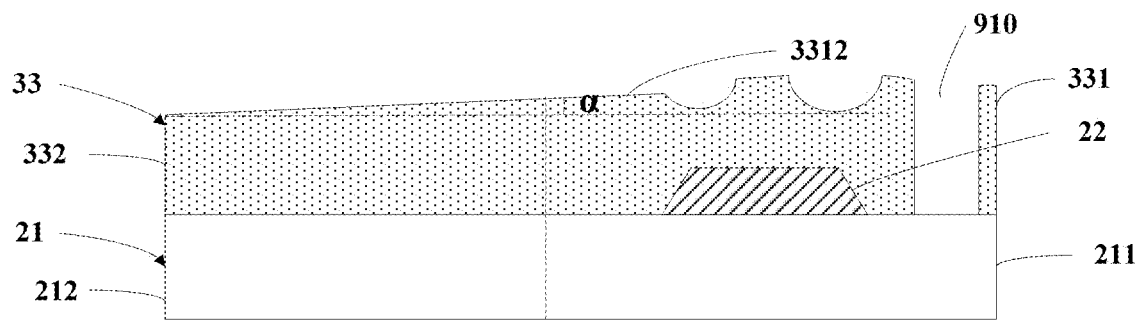
FIG. 9 is a cross-sectional view showing a structure at another stage during a manufacturing process of a display substrate according to an embodiment of the present disclosure.

In other embodiments, the step of performing the patterning process on the planarization layer may be described in conjunction with FIGS. 8A, 8B, and 9.

As shown in FIG. 8A, an exposure process is performed on the planarization layer 33 by a mask plate 80. As shown in FIGS. 8A and 8B, the mask plate 80 may comprise a first region 801. The first region 801 may comprise at least one first light transmitting region having a slit shape. For example, the at least one first light transmitting region comprises a plurality of first light transmitting regions (e.g., the first light transmitting regions 811, 812, and 813). The at least one first light transmitting region corresponds to the first planarization layer 331. In some embodiments, similar to the foregoing, the mask plate may further comprise a second region 802 adjacent to the first region 801. In addition, FIG. 8A also shows a light beam 82 for exposure.

In some embodiments, as shown in FIGS. 8A and 8B, a width $c1$ of the first light transmitting region $811<$ a width $c2$ of the first light transmitting region $812<$ a width $c3$ of the first light transmitting region 813.

Next, as shown in FIG. 9, after the exposure process is performed, a development process is performed on the planarization layer 33. A via hole 910 passing through the planarization layer 33 is formed in apart of the planarization layer 33 corresponding to one of the at least one first light transmitting region. Here, the corresponding part does not overlap with the pattern structure, so as to ensure that the via hole may be formed at the part. For example, a width of the first light transmitting region 813 is large, and during the exposure process, the light intensity of the light beam passing through the first light transmitting region 813 is large. Thus, the part of the planarization layer corresponding to the first light transmitting region 813 is exposed more. During development, the part of the planarization layer may be removed more, so that a via hole 910 may be formed, so as to subsequently form an electrode layer (e.g., an anode layer) passing through the via hole.

So far, a manufacturing method for a display substrate according to other embodiments of the present disclosure is provided. By way of the manufacturing method, instead of forming the second light transmitting region in the mask plate, one first light transmitting region functions as the above-described second light transmitting region, so as to form a via hole in the planarization layer in the development step. This may simplify the pattern of the mask plate and reduce the cost. The above-described method may reduce an average height of the surface of the first planarization layer on the side away from the base substrate, and reduce the slope angle α, thereby further reducing the problem of color cast between view angles of the display screen and improving the display effect of the display screen. Compared with the manufacturing method in which exposure and development are performed after the planarization layer is patterned, the times of exposure and development in this manufacturing method are reduced, so that this manufacturing method may reduce the cost.

Figure 10A:
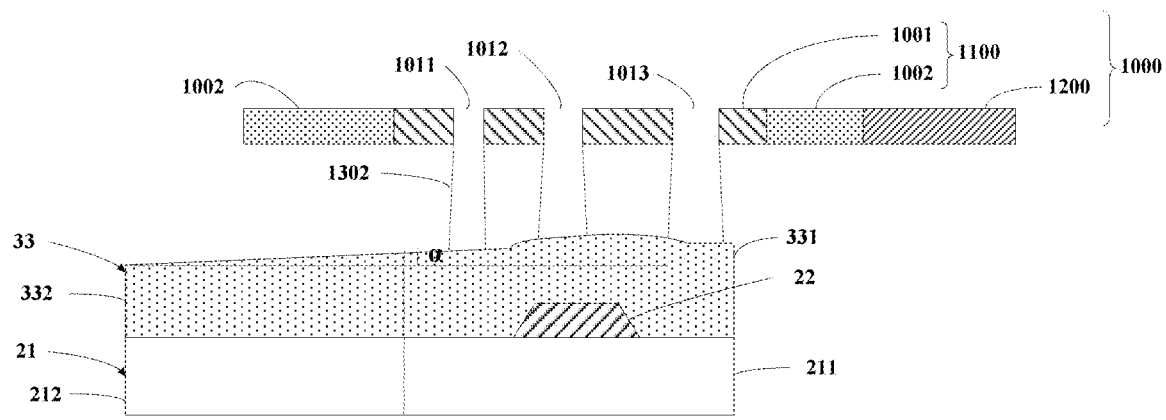
FIG. 10A is a cross-sectional view showing a structure at another stage during a manufacturing process of a display substrate according to an embodiment of the present disclosure.
Figure 10B:
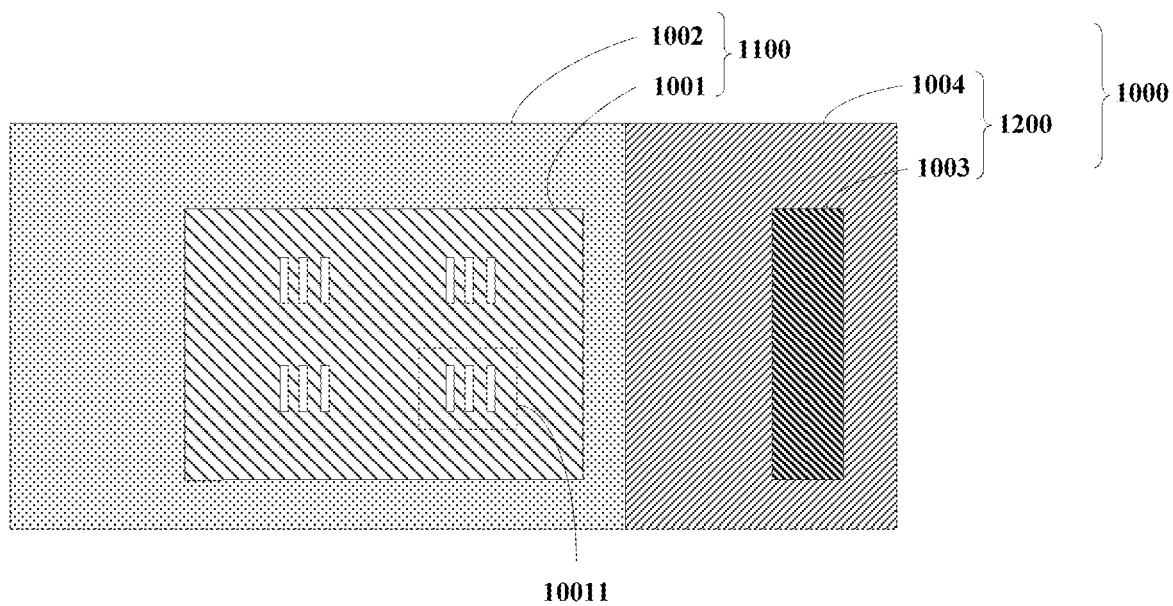
FIG. 10B is a top view showing a mask plate according to another embodiment of the present disclosure.
Figure 10C:
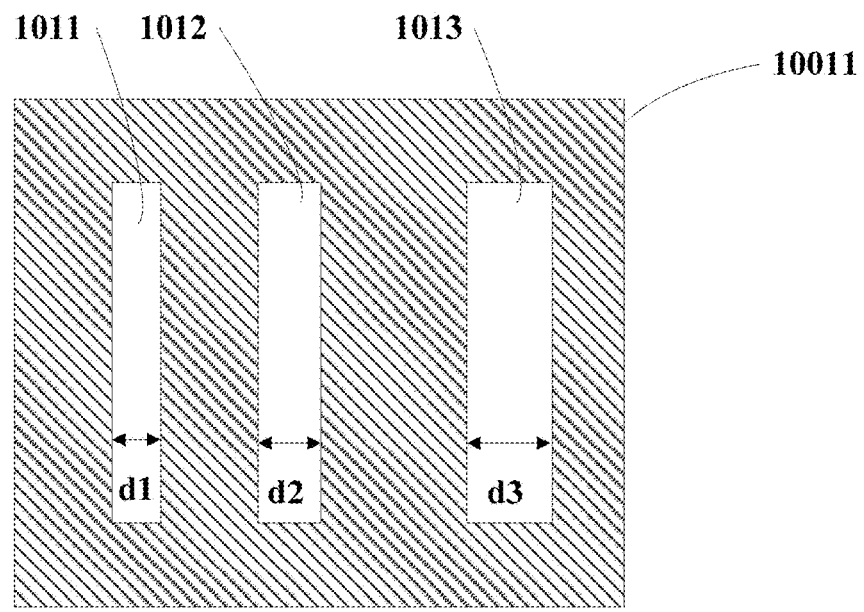
FIG. 10C is a partially enlarged view showing a structure in FIG. 10B.

In other embodiments, the step of performing the patterning process on the planarization layer may be described in conjunction with FIGS. 10A, 10B, 10C, and 11. It should be noted that, for convenience of illustration, FIG. 10A shows a cross-sectional view of a first light transmitting region group 10011 in FIG. 10B. In addition, FIG. 10C is an enlarged schematic view of the first light transmitting region group 10011 in FIG. 10B.

As shown in FIG. 10A, an exposure process is performed on the planarization layer 33 by the mask plate 1000. As shown in FIGS. 10A, 10B, and 10C, the mask plate 1000 may comprise a first region 1100. The first region 1100 may comprise a first film layer 1001 having a first transmittance and a second film layer 1002 having a second transmittance that is adjacent to the first film layer 1001. The first film layer and the second film layer are configured to expose the planarization layers at different positions on the display substrate. For example, the second film layer 1002 surrounds the first film layer 1001. The first transmittance is less than the second transmittance. For example, the first transmittance ranges from 19% to 23%, and the second transmittance is 100%. That is, the first film layer 1001 may be a translucent film layer, and the second film layer 1002 may be a completely transparent film layer. The first film layer 1001 comprises at least one first light transmitting region having a slit shape. For example, the first film layer comprises a plurality of first light transmitting region groups 10011. During the exposure process, each first light transmitting region group is aligned with a sub-pixel. The first light transmitting region group may comprise at least one first light transmitting region. For example, the at least one first light transmitting region may comprise a plurality of first light transmitting regions (e.g., the first light transmitting regions 1011, 1012, and 1013). The at least one first light transmitting region corresponds to the first planarization layer 331. In addition, FIG. 10A also shows a light beam 1302 for exposure.

In some embodiments, similar to the foregoing description, as shown in FIG. 10C, a width d1 of the first light transmitting region 1011<a width d2 of the first light transmitting region 1012<a width d3 of the first light transmitting region 1013.

In some embodiments, the mask plate 1000 may further comprise a second region 1200 adjacent to the first region 1100. The second region 1200 may comprise a third film layer 1003 having a third transmittance and a fourth film layer 1004 having a fourth transmittance that is adjacent to the third film layer 1003. For example, during the exposure process, the third film layer 1003 is aligned with the COF (Chip On Film) area in the non-display area, so that the planarization layer in the COF area may be exposed. The fourth film layer 1004 may surround the third film layer 1003. The fourth film layer 1004 is adjacent to the second film layer 1002. For example, the third transmittance is less than the fourth transmittance, and the third transmittance is not equal to the first transmittance. The second transmittance may be equal to the fourth transmittance. The third transmittance may range from 19% to 23%, and the fourth transmittance may be 100%. That is, the third film layer 1003 may be a translucent film layer, and the fourth film layer 1004 may be a completely transparent film layer. In some embodiments, the second region of the mask plate may be a halftone mask.

In some embodiments, materials of the first film layer 1001, the second film layer 1002, the third film layer 1003, and the fourth film layer 1004 may comprise chromium (Cr). In some embodiments, the first film layer 1001, the second film layer 1002, the third film layer 1003, and the fourth film layer 1004 may comprise a Cr film and a light shielding film on the Cr film respectively. That is, the light shielding film may be plated on the Cr film, and a material of the light shielding film (comprising material structure, the content of substances in the material, and the like) may cause the light shielding film to have different transmittances. In this way, the first film layer, the second film layer, the third film layer, and the fourth film layer may have their respective transmittances.

In the above embodiment, by designing the transmittances of the first film layer, the second film layer, the third film layer, and the fourth film layer, the extents of exposures to different parts of the entire planarization layer may be controlled according to different conditions, so that the different parts of the planarization layer may be developed at different extents.

Figure 11:
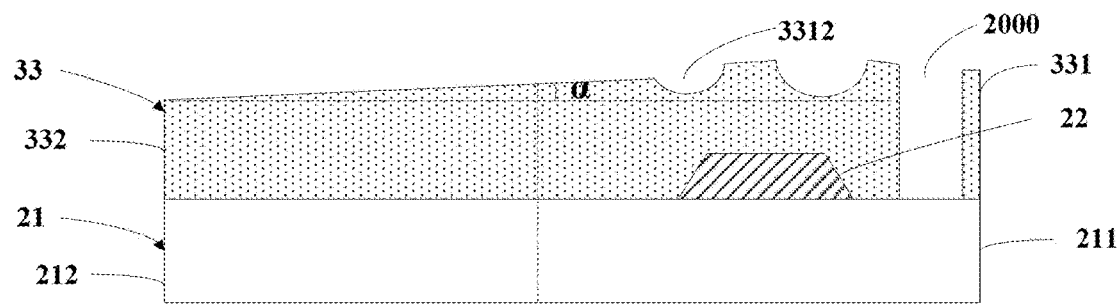
FIG. 11 is a cross-sectional view showing a structure at another stage during a manufacturing process of a display substrate according to an embodiment of the present disclosure.

Next, as shown in FIG. 11, after the exposure process is performed, a development process is performed on the planarization layer 33 so as to remove a part of the planarization layer 33 corresponding to the second film layer 1002 (i.e., a part of the planarization layer aligned with the second film layer during the exposure process, not shown), and remove apart of the planarization layer corresponding to the first film layer 1001 (i.e., a part of the planarization layer aligned with the first film layer during the exposure process) so as to reduce the height of the surface of the first planarization layer on the side away from the base substrate.

In some embodiments, since a width of the first light transmitting region 1013 is large, the light intensity of the light beam passing through the first light transmitting region is large during the exposure process. In this way, a part of the planarization layer corresponding to the first light transmitting region 1013 is exposed more. Therefore, during development, a via hole 2000 may be formed in the part, so that an electrode layer (e.g., an anode layer) passing through the via hole may be subsequently formed.

In other embodiments, a second light transmitting region may also be provided in the first film layer, so that a via hole passing through the planarization layer may be formed in a part of the planarization layer corresponding to the second light transmitting region after exposure and development.

So far, a manufacturing method for a display substrate according to other embodiments of the present disclosure is provided. By the manufacturing method, not only a via hole passing through the planarization layer is formed in the planarization layer, but also it is possible to reduce an average height of the surface of the first planarization layer on the side away from the base substrate, and reduce the slope angle α, thereby reducing the problem of color cast between view angles of the display screen and improving the display effect of the display.

Figure 12:
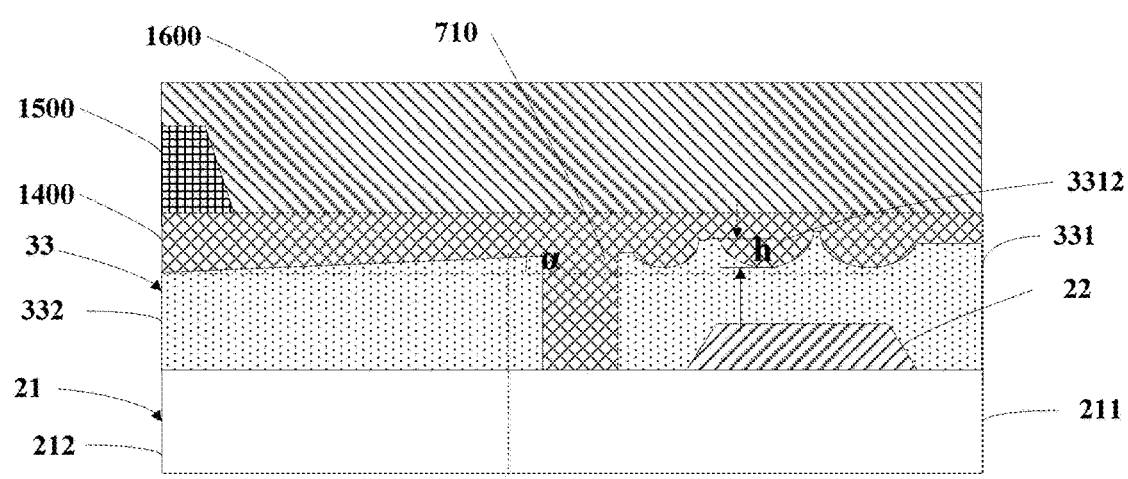
FIG. 12 is a cross-sectional view showing a structure at another stage during a manufacturing process of a display substrate according to an embodiment of the present disclosure.

In some embodiments, the above-described manufacturing method may further comprise: as shown in FIG. 12, forming an electrode layer (e.g., an anode layer) 1400 on the planarization layer 33. A part of the electrode layer 1400 passes through the via hole 710 (or the via hole 910 or 2000) and is connected to a source or a drain of a thin film transistor (not shown) in the base substrate.

In some embodiments, the above-described manufacturing method may further comprise: as shown in FIG. 12, forming a functional layer 1600 for a sub-pixel (e.g., a red sub-pixel) on the electrode layer 1400. For example, the functional layer 1600 may comprise at least a light emitting layer. As another example, the functional layer 1600 may further comprise an electron transport layer and a hole transport layer. In some embodiments, a pixel defining layer 1500 is first formed on the electrode layer 1400, wherein the pixel defining layer has an opening exposing the electrode layer; and then the functional layer 1600 passing through the opening is formed.

In the above embodiments, the height of the upper surface of the first planarization layer is reduced due to the aforementioned manufacturing method. In this way, during the process of forming a functional layer (e.g., a light emitting layer) above the planarization layer, the slope angle of the functional layer (e.g., the light emitting layer) may be reduced, thereby reducing the problem of color cast between view angles of the display screen, and improving the display effect of the display screen. For example, the reduced slope angle ranges from 0 degree to 0.5 degree.

According to the above-described manufacturing method, a display substrate such as the display substrate shown in FIG. 5, FIG. 7, FIG. 9, FIG. 11, or FIG. 12 may also be formed. The display substrate shown in FIG. 12 will be taken as an example below to describe in detail the display substrate according to some embodiments of the present disclosure.

As shown in FIG. 12, the display substrate may comprise a base substrate 21. The base substrate 21 may comprise a first substrate portion 211 and a second substrate portion 212 adjacent to the first substrate portion 211. The display substrate may further comprise a pattern structure 22 on the first substrate portion 211. The display substrate may further comprise a planarization layer 33 on the base substrate 21. The planarization layer 33 may comprise a first planarization layer 331 on the first substrate portion 211 and a second planarization layer 332 on the second substrate portion 212. The first planarization layer 331 and the second planarization layer 332 are a continuous layer structure. A projection of the first planarization layer 331 on the base substrate 21 at least partially covers a projection of the pattern structure 22 on the base substrate 21. For example, the first planarization layer 331 covers the pattern structure 22. The first planarization layer 331 may comprise at least one recess 3312.

In some embodiments, the pattern structure 22 may comprise a conductive wire (e.g., a data line). The recess 3312 may comprise a groove. For example, an extension direction of the conductive wire is the same as an extending direction of the groove.

In some embodiments, at least part of a projection of the at least one recess 3312 on the base substrate 21 overlaps with at least part of the projection of the pattern structure 22 on the base substrate 21.

In some embodiments, a depth h of the recess 3312 may range from 0.01 micrometer to 0.5 micrometer. For example, the depth h of the recess may be 0.05 micrometer, 0.1 micrometer, 0.3 micrometer, or the like. The depth h of the recess refers to a distance between a bottom of the recess and a top of the protrusion around the recess.

In some embodiments, as shown in FIG. 12, the planarization layer 33 has a via hole 710 passing through the planarization layer. The via hole 710 exposes a part of the base substrate 21.

In some embodiments, as shown in FIG. 12, the display substrate may further comprise an electrode layer 1400 on the planarization layer 33. The electrode layer 1400 passes through the via 710 and is connected to a source or a drain (not shown) of a thin film transistor in the base substrate.

In some embodiments, as shown in FIG. 12, the display substrate may further comprise a functional layer 1600 for a sub-pixel (e.g., a red sub-pixel) on the electrode layer 1400.

In some embodiments, as shown in FIG. 12, the display substrate may further comprise a pixel defining layer 1500 on the electrode layer 1400. The functional layer 1600 passes through the pixel defining layer 1500 and is connected to the electrode layer 1400.

According to some embodiments of the present disclosure, a display device is also provided. The display device may comprise the display substrate described above (e.g., the display substrate shown in FIG. 5, FIG. 7, FIG. 9, FIG. 11, or FIG. 12). For example, the display device may be any product or component having a display function, such as a display panel, a display screen, a display, a mobile phone, a tablet computer, a notebook computer, a television, or a navigator.

In some embodiments of the present disclosure, a mask plate is further provided. The mask plate may comprise at least one first light transmitting region having a slit shape. The at least one first light transmitting region is configured to correspond to the first planarization layer in a red sub-pixel. That is, the first light transmitting region is aligned with the first planarization layer. A width of each first light transmitting region may range from 1 micrometer to 1.5 micrometers, and a length of each first light transmitting region may range from 50 micrometers to 55 micrometers.

Hereto, various embodiments of the present disclosure have been described in detail. Some details well known in the art are not described to avoid obscuring the concept of the present disclosure. According to the above description, those skilled in the art would fully know how to implement the technical solutions disclosed herein.

Although some specific embodiments of the present disclosure have been described in detail by way of examples, those skilled in the art should understand that the above examples are only for the purpose of illustration and are not intended to limit the scope of the present disclosure. It should be understood by those skilled in the art that modifications to the above embodiments or equivalently substitution of part of the technical features may be made without departing from the scope and spirit of the present disclosure. The scope of the present disclosure is defined by the appended claims.

What is claimed is:

1. A manufacturing method for a display substrate, comprising:
forming a conductive wiring on a base substrate, wherein the base substrate comprises a first substrate portion and a second substrate portion adjacent to the first substrate portion, and the conductive wiring is formed on the first substrate portion;
forming a planarization layer having a first slope the base substrate, the planarization layer comprising a first planarization layer on the first substrate portion and a second planarization layer on the second substrate portion, wherein a projection of the first planarization layer on the base substrate at least partially covers a projection of the conductive wiring on the base substrate, and a height from at least part of a surface of the first planarization layer on a side away from the base substrate to the base substrate is higher than a height from a surface of the second planarization layer on a side away from the base substrate to the base substrate; and
removing a part of the first planarization layer to create a recess therein so as to reduce a height difference between the height from the at least part of the surface of the first planarization layer on the side away from the base substrate to the base substrate and the height from the surface of the second planarization layer on the side away from the base substrate to the base substrate, wherein the recess has a second slope angle that is less than the first slope angle of the planarization layer.

2. The manufacturing method according to claim 1, wherein
the projection of the first planarization layer on the base substrate completely covers the projection of the conductive wiring on the base substrate.

3. The manufacturing method according to claim 1, wherein the removing of the part of the first planarization layer comprises:
performing an exposure process on the first planarization layer by a mask plate, wherein the mask plate comprises at least one first light transmitting region having a slit shape, and the at least one first light transmitting region corresponds to the first planarization layer; and
performing a development process on the first planarization layer after the exposure process is performed.

4. The manufacturing method according to claim 3, wherein
the mask plate comprises a plurality of light transmitting regions including the at least one first light transmitting region distributed along the same direction as a length direction of the conductive wiring;
wherein the greater the height from the at least part of the surface of the first planarization layer on the side away from the base substrate to the base substrate is, the greater a width of the at least one first light transmitting region corresponding to the at least part of the surface of the first planarization layer in the plurality of first light transmitting regions is; or the greater the height from the at least part of the surface of the first planarization layer on the side away from the base substrate to the base substrate is, the greater a distribution density of the plurality of light transmitting regions corresponding to the at least part of the surface of the first planarization layer in the plurality of light transmitting regions is.

5. The manufacturing method according to claim 1, performing a patterning process on the planarization layer after the planarization layer is formed.

6. The manufacturing method according to claim 5, wherein the performing of the patterning process on the planarization layer comprises:
performing an exposure process on the planarization layer by a mask plate, wherein the mask plate comprises a first region comprising at least one first light transmitting region having a slit shape and at least one second light transmitting region, and the at least one first light transmitting region corresponds to the first planarization layer; and
performing a development process on the planarization layer after the exposure process is performed, so as to remove the part of the first planarization layer, and form a via hole passing through the planarization layer in a part of the planarization layer corresponding to the at least one second light transmitting region.

7. The manufacturing method according to claim 6, wherein:
a width of each of the at least one first light transmitting region ranges from 1 micrometer to 1.5 micrometers, and a length of each of the at least one first light transmitting region ranges from 50 micrometers to 55 micrometers; and
a radial dimension of each of the at least one second light transmitting region ranges from 4.5 micrometers to 5.5 micrometers.

8. The manufacturing method according to claim 5, wherein the performing of the patterning process on the planarization layer comprises:
performing an exposure process on the planarization layer by a mask plate, wherein the mask plate comprises a first region comprising at least one first light transmitting region having a slit shape, and the at least one first light transmitting region corresponds to the first planarization layer; and
performing a development process on the planarization layer after the exposure process is performed, wherein a via hole passing through the planarization layer is formed in a part of the planarization layer corresponding to one of the at least one first light transmitting region.

9. The manufacturing method according to claim 5, wherein the performing of the patterning process on the planarization layer comprises:
performing an exposure process on the planarization layer by a mask plate, wherein the mask plate comprises a first region comprising a first film layer having a first transmittance and a second film layer having a second transmittance that is adjacent to the first film layer, the first transmittance is less than the second transmittance, the first film layer comprises at least one first light transmitting region having a slit shape, and the at least one first light transmitting region corresponds to the first planarization layer; and
performing a development process on the planarization layer after the exposure process is performed, so as to remove a part of the planarization layer corresponding to the second film layer, and to remove a part in a part of the planarization layer corresponding to the first film layer.

10. The manufacturing method according to claim 8, wherein:
the mask plate further comprises a second region adjacent to the first region, wherein the second region comprises a third film layer having a third transmittance and a fourth film layer having a fourth transmittance that is adjacent to the third film layer, the third transmittance is less than the fourth transmittance, the third transmittance is not equal to the first transmittance, and the second transmittance is equal to the fourth transmittance.

11. The manufacturing method according to claim 3, wherein
the first light transmitting region is a slit.

12. The manufacturing method according to claim 1, further comprising:
forming an electrode layer on the planarization layer; and
forming a functional layer for a sub-pixel on the electrode layer.

13. The manufacturing method according to claim 1, wherein
the conductive wiring comprises a conductive wire.

14. A display substrate, comprising:
a base substrate, wherein the base substrate comprises a first substrate portion and a second substrate portion adjacent to the first substrate portion;
a conductive wiring on the first substrate portion; and
a planarization layer having a first slope angle, on the base substrate, wherein the planarization layer comprises a first planarization layer on the first substrate portion and a second planarization layer on the second substrate portion, a projection of the first planarization layer on the base substrate at least partially covers a projection of the conductive wiring on the base substrate, and the first planarization layer comprises at least one recess, wherein the at least one recess has a second slope angle that is less than the first slope angle of the planarization layer.

15. The display substrate according to claim 14, wherein at least part of a projection of the at least one recess on the base substrate overlaps with at least part of the projection of the conductive wiring on the base substrate.

16. The display substrate according to claim 14, wherein a depth of the at least one recess ranges from 0.01 micrometer to 0.5 micrometer.

17. The display substrate according to claim 14, wherein:
the at least one recess comprises a groove;
wherein an extending direction of the conductive wire is the same as an extending direction of the groove.

18. The display substrate according to claim 14, further comprising:
an electrode layer on the planarization layer and a functional layer for a sub-pixel on the electrode layer.

19. A display device, comprising: the display substrate according to claim 14.

* * * * *